United States Patent [19]

Michel

[11] Patent Number: 4,898,851

[45] Date of Patent: Feb. 6, 1990

[54] PROCESS FOR MAKING 90 K SUPERCONDUCTORS USING A SPRAY DRIED OXALATE PRECURSOR

[75] Inventor: John B. Michel, Wilmington, Del.

[73] Assignee: E. I. Du Pont de Nemours and Company, Wilmington, Del.

[21] Appl. No.: 64,951

[22] Filed: Jun. 22, 1987

[51] Int. Cl.[4] .......... C01F 17/00; C01G 3/02; C04B 35/64; H01L 39/12

[52] U.S. Cl. .............. 505/1; 252/518; 252/521; 423/263; 423/593; 501/123; 501/152; 505/809; 505/810; 505/815

[58] Field of Search ........... 252/521, 518; 423/263, 423/593; 501/152, 123; 505/1, 809, 810, 815

[56] References Cited

U.S. PATENT DOCUMENTS

| | | | |
|---|---|---|---|
| 4,318,995 | 3/1982 | Rhodes | 501/1 |
| 4,567,031 | 1/1986 | Riley | 423/593 |
| 4,610,866 | 9/1986 | Debsikdar | 423/600 |
| 4,693,986 | 9/1987 | Vit | 501/1 |

OTHER PUBLICATIONS

Moodenbaugh, A. R. et al., "Preparation of YBa$_2$Cu$_3$O$_7$ and Related Compounds", Proc. MRS, 1987, Spring Meeting, pp. 101–102, Apr. 23–24, 1987.
Bednorz et al., Z. Phys., B64, 189–193 (1986).
Chu et al., Phys. Rev. Lett. 58, 405–407 (1987).
Chu et al., Science 235, 567–569 (1987).
Cava et al., Phys. Rev. Lett. 58, 408–410 (1987).
Rao et al., Current Science 56, 47–49 (1987).
Bednorz et al., Europhys. Lett. 3, 379–384 (1987).
Wu et al., Phys. Rev. Lett. 58, 908–910 (1987).
Hor et al., Phys. Rev. Lett. 58, 911–912 (1987).
Sun et al., Phys. Rev. Lett. 58, 1574–1576 (1987).
Cava et al., Phys. Rev. Lett. 58, 1676–1679 (1987).
Takita et al., Jpn. J. Appl. Phys. 26, L506–L507 (1987).
Takabatake et al., Jpn. J. Appl. Phys. 26, L502–L503 (1987).
Syono et al., Jpn. J. Appl. Phys. 26, L498–L501 (1987).
Takayama-Muromachi et al., Jpn. J. Appl. Phys. 26, L476–L478 (1987).
Hosoya et al., Jpn. J. Appl. Phys. 26, L456–L457 (1987).
Hirabayashi et al., Jpn. J. Appl. Phys. 26, L454–L455 (1987).
Ekino et al., Jpn. J. Appl. Phys. 26, L452–L453 (1987).
Akimitsu et al., Jpn. J. Appl. Phys. 26, L449–L451 (1987).
Semba et al., Jpn. J. Appl. Phys. 26, L429–L431 (1987).
Hatano et al., Jpn. J. Appl. Phys. 26, L374–L376 (1987).
Hikami et al., Jpn. J. Appl. Phys. 26, L347–L348 (1987).
Matsushita et al., Jpn. J. Appl. Phys. 26, L332–L333 (1987).
Maeno et al., Jpn. J. Appl. Phys. 26, L329–L331 (1987).
Iguchi et al., Jpn. J. Appl. Phys. 26, L327–L328 (1987).
Hosoya et al., Jpn. J. Appl. Phys. 26, L325–L326 (1987).
Takagi et al., Jpn. J. Appl. Phys. 26, L320–L321 (1987).
Hikami et al., Jpn. J. Appl. Phys. 26, L314–L315 (1987).
Bourne et al., Phys. Lett. A 120, 494–496 (1987).
Moodenbaugh et al., Phys. Rev. Lett. 58, 1885–1887 (1987).
Hor et al., Phys. Lett. 58, 1891–1894 (1987).

Primary Examiner—Dennis Albrecht

[57] ABSTRACT

There is disclosed an improved process for preparing a superconducting composition having the formula MBa$_2$Cu$_3$O$_x$ wherein M is selected from the group consisting of Y, Nd, Sm, Eu, Gd, Dy, Ho, Er, Tm, Yb and Lu; x is from about 6.5 to about 7.0; said composition having a superconducting transition temperature of about 90 K; said process consisting essentially of heating a precursor powder in an oxygen-containing atmosphere at a temperature from about 875° C. to about 950° C. for a time sufficient to form MBa$_2$Cu$_3$O$_y$, where y is from about 6.0 to about 6.4; and maintaining the MBa$_2$Cu$_3$O$_y$ in an oxygen-containing atmosphere while cooling for a time sufficient to obtain the desired product; said precursor powder being prepared by (a) forming an aqueous solution of M(NO$_3$)$_3$, Ba(NO$_3$)$_2$ and Cu(NO$_3$)$_2$ in an atomic ratio of M:Ba:Cu of about 1:2:3, (b) adding the resulting solution to sufficient oxalic acid to precipitate the metals present as salts, and spray drying the resulting slurry to obtain the precursor powder.

12 Claims, No Drawings

PROCESS FOR MAKING 90 K SUPERCONDUCTORS USING A SPRAY DRIED OXALATE PRECURSOR

BACKGROUND OF THE INVENTION

1. Field of the Invention

This invention relates to an improved process for making rare earth-barium-copper oxide superconductors with transition temperatures above 90K.

2. Description of Related Art

Bednorz and Muller, *Z. Phys.* B64, 189-193 (1986), disclose a superconducting phase in the La-Ba-Cu-O system with a superconducting transition temperature of about 35K. Samples were prepared by a coprecipitation method from aqueous solutions of Ba-, La- and Cu-nitrate in their appropriate ratios. An aqueous solution of oxalic acid was used as the precipitant.

Chu et al., *Phys. Rev. Lett.* 58, 405-407 (1987), report detection of an apparent superconducting transition with an onset temperature above 40K under pressure in the La-Ba-Cu-O compound system synthesized directly from a solid-state reaction of $La_2O_3$, CuO and $BaCO_3$ followed by a decomposition of the mixture in a reduced atmosphere. Chu et al., *Science* 235, 567-569 (1987), disclose that a superconducting transition with an onset temperature of 52.5K has been observed under hydrostatic pressure in compounds with nominal compositions given by $(La_{0.9}Ba_{0.1})_2CuO_{4-y}$, where y is undetermined. They state that the $K_2NiF_4$ layer structure has been proposed to be responsible for the high-temperature superconductivity in the La-Ba-Cu-O system (LBCO). They further state that, however, the small diamagnetic signal, in contrast to the presence of up to 100% $K_2NiF_4$ phase in their samples, raises a question about the exact location of superconductivity in LBCO.

Cava et al., *Phys. Rev. Lett.* 58, 408-410 (1987), disclose bulk superconductivity at 36K in $La_{1.8}Sr_{0.2}CuO_4$ prepared from appropriate mixtures of high purity $La(OH)_3$, $SrCO_3$ and CuO powders, heated for several days in air at 1000° C. in quartz crucibles. Rao et al., *Current Science* 56, 47-49 (1987), discuss superconducting properties of compositions which include $La_{1.8}Sr_{0.2}CuO_4$, $La_{1.85}Ba_{0.15}CuO_4$, $La_{1.8}Sr_{0.1}CuO_4$, $(La_{1-x}Pr_x)_{2-y}Sr_yCuO_4$, and $(La_{1.75}Eu_{0.25})Sr_{0.2}CuO_4$. Bednorz et al., *Europhys. Lett.* 3, 379-384 (1987), report that susceptibility measurements support high-$T_c$ superconductivity in the Ba-La-Cu-O system. In general, in the La-Ba-Cu-O system, the superconducting phase has been identified as the composition $La_{1-x}(Ba,Sr,Ca)_xO_4-y$ with the tetragonal $K_2NiF_4$-type structure and with x typically about 0 15 and y indicating oxygen vacancies.

Wu et al., *Phys. Rev. Lett.* 58, 908-910 (1987), disclose a superconducting phase in the Y-Ba-Cu-O system with a superconducting transition temperature between 80 and 93K. The compounds investigated were prepared with nominal composition $(Y_{1-x}Ba_x)_2CuO_{4-y}$ and x=0.4 by a solid-state reaction of appropriate amounts of $Y_2O_3$, $BaCO_3$ and CuO in a manner similar to that described in Chu et al., *Phys. Rev. Lett.* 58, 405-407 (1987). Said reaction method comprises more specifically heating the oxides in a reduced oxygen atmosphere of $2\times10^{-5}$ bars (2 Pa) at 900° C. for 6 hours. The reacted mixture was pulverized and the heating step was repeated. The thoroughly reacted mixture was then pressed into 3/16 inch (0.5 cm) diameter cylinders for final sintering at 925° C. for 24 hours in the same reduced oxygen atmosphere. The material prepared showed the existence of multiple phases.

Hor et al., *Phys. Rev. Lett.* 58, 911-912 (1987), disclose that pressure has only a slight effect on the superconducting transition temperature of the Y-Ba-Cu-O superconductors described by Wu et al., supra.

Sun et al., *Phys. Rev. Lett.* 58, 1574-1576 (1987), disclose the results of a study of Y-Ba-Cu-0 samples exhibiting superconductivity with transition temperatures in the 90K range. The samples were prepared from mixtures of high-purity $Y_2O_3$, $BaCO_3$ and CuO powders. The powders were premixed in methanol or water and subsequently heated to 100° C. to evaporate the solvent. Two thermal heat treatments were used. In the first, the samples were heated in Pt crucibles for 6 hours in air at 850° C. and then for another 6 hours at 1000° C. After the first firing, the samples were a dark-green powder, and after the second firing, they became a very porous, black solid. In the second method, the powders were heated for 8-10 hours at 1000° C., ground and then cold pressed to form disks of about 1 cm diameter and 0.2 cm thickness. The superconducting properties of samples prepared in these two ways were similar. X-ray diffraction examination of the samples revealed the existence of multiple phases.

Cava et al., *Phys. Rev. Lett.* 58, 1676-1679 (1987), have identified this superconducting Y-Ba-Cu-O phase to be orthorhombic, distorted, oxygen-deficient perovskite $YBa_2Cu_3O_{9-\delta}$ where $\delta$ is about 2.1, and have presented the X-ray diffraction powder pattern and lattice parameters for the phase. The single-phase $YBa_2Cu_3O_{9-\delta}$ was prepared in the following manner. $BaCO_3$, $Y_2O_3$ and CuO were mixed, ground and then heated at 950° C. in air for 1 day. The material was then pressed into pellets, sintered in flowing O for 16 hours and cooled to 200° C. in $O_2$ before removal from the furnace. Additional overnight treatment in $O_2$ at 700° C. was found to improve the observed properties.

Takita et al., *Jpn. J. Appl. Phys.* 26, L506-L507 (1987), disclose the preparation of several Y-Ba-Cu compositions with superconducting transitions around 90K by a solid-state reaction method in which a mixture of $Y_2O_3$, CuO, and $BaCO_3$ was heated in an oxygen atmosphere at 950° C. for more than 3 hours. The reacted mixture was pressed into 10 mm diameter disks for final sintering at 950° or 1000° C. for about 3 hours in the same oxygen atmosphere.

Takabatake et al., *Jpn. J. Appl. Phys.* 26, L502-L503 (1987), disclose the preparation of samples of $Ba_{1-x}Y_xCuO_{3-z}$ (x=0.1, 0.2 0.25, 0.3, 0.4, 0.5, 0.6, 0.8 and 0.9) from the appropriate mixtures of $BaCO_3$, $Y_2O_3$ and CuO. The mixture was pressed into a disc and sintered at 900° C. for 15 hours in air. The sample with x =0.4 exhibited the sharpest superconducting transition with an onset near 96K.

Syono et al., *Jpn. J. Appl. Phys.* 26, L498-L501 (1987), disclose the preparation of samples of superconducting $Y_{0.4}Ba_{0.6}CuO_{2.22}$ with $T_c$ higher than 88K by firing mixtures of 4N $Y_2O_3$, 3N $BaCO_3$ and 3N CuO in the desired proportions. The mixtures were prefired at 1000° C. for 5 hours. They were ground, pelletized and sintered at 900° C. for 15 hours in air and cooled to room temperature in the furnace. They also disclose that almost equivalent results were also obtained by starting from concentrated nitrate solution of 4N $Y_2O_3$, GR grade $Ba(NO_3)_2$ and $Cu(NO_3)_2$.

Takayama-Muromachi et al., *Jpn. J. Appl. Phys.* 26, L476-L478 (1987), disclose the preparation of a series of samples to try to identify the superconducting phase in the Y-Ba-Cu-O system. Appropriate amounts of $Y_2O_3$, $BaCO_3$ and $CuO$ were mixed in an agate mortar and then fired at $1173 \pm 2$ K for 48-72 hours with intermediate grindings. X-ray diffraction powder patterns were obtained. The suggested composition of the superconducting compound is $Y_{1-x}Ba_xCuO_y$ where $0.6 < x < 0.7$.

Hosoya et al., *Jpn. J. Appl. Phys.* 26, L456-L457 (1987), disclose the preparation of various superconductor compositions in the L-Ba-Cu-O systems where L=Tm, Er, Ho, Dy, Eu and Lu. Mixtures of the proper amounts of the lanthanide oxide (99.9% pure), CuO and $BaCO_3$ were heated in air. The obtained powder specimens were reground, pressed into pellets and heated again.

Hirabayashi et al., *Jpn. J. Appl. Phys.* 26, L454-L455 (1987), disclose the preparation of superconductor samples of nominal composition $Y_{1/3}Ba_{2/3}CuO_{3-x}$ by co-precipitation from aqueous nitrate solution. Oxalic acid was used as the precipitant and insoluble Ba, Y and Cu compounds were formed at a constant pH of 6.8. The decomposition of the precipitate and the solid-state reaction were performed by firing in air at 900° C. for 2 hours. The fired products were pulverized, cold-pressed into pellets and then sintered in air at 900° C. for 5 hours. The authors found that the sample was of nearly single phase having the formula $Y_1Ba_2Cu_3O_7$. The diffraction pattern was obtained and indexed as having tetragonal symmetry.

Ekino et al., *Jpn. J. Appl. Phys.* 26, L452-L453 (1987), disclose the preparation of a superconductor sample with nominal composition $Y_{1.1}Ba_{0.9}CuO_{4-y}$. A prescribed amount of powders of $Y_2O_3$, $BaCO_3$ and $CuO$ was mixed for about an hour, pressed under 6.4 ton/$cm^2$ (14 MPa) into pellet shape and sintered at 1000° C. in air for 3 hours.

Akimitsu et al., *Jpn. J. Appl. Phys.* 26, L449-L451 (1987), disclose the preparation of samples with nominal compositions represented by $(Y_{1-x}Ba_x)_2CuO_{4-y}$. The specimens were prepared by mixing the appropriate amounts of powders of $Y_2O_3$, $BaCO_3$ and CuO. The resulting mixture was pressed and heated in air at 1000° C. for 3 hours. Some samples were annealed at appropriate temperatures in $O_2$ or $CO_2$ for several hours. The authors noted that there seemed to be a tendency that samples annealed in $O_2$ showed a superconducting transition with a higher onset temperature but a broader transition than non-annealed samples.

Semba et al., *Jpn. J. Appl. Phys.* 26, L429-L431 (1987), disclose the preparation of samples of $Y_xBa_{1-x}CuO_{4-d}$ where x=0.4 and x=0.5 by the solid state reaction of $BaCO_3$, $Y_2O_3$ and CuO. The mixtures are heated to 950° C. for several hours, pulverized, and then pressed into disk shape. This is followed by the final heat treatment at 1100° C. in one atmosphere $O_2$ gas for 5 hours. The authors identified the phase that exhibited superconductivity above 90K as one that was black with the atomic ratio of Y:Ba:Cu of 1:2:3. The diffraction pattern was obtained and indexed as having tetragonal symmetry.

Hatano et al., *Jpn. J. Appl. Phys.* 26, L374-L376 (1987), disclose the preparation of the superconductor compound $Ba_{0.7}Y_{0.3}Cu_1O_x$ from the appropriate mixture of $BaCO_3$ (purity 99.9%), $Y_2O_3$ (99.99%) and CuO (99.9%). The mixture was calcined in an alumina boat heated at 1000° C. for 10 hours in a flowing oxygen atmosphere. The color of the resulting well-sintered block was black.

Hikami et al., *Jpn. J. Appl. Phys.* 26, L347-L348 (1987), disclose the preparation of a Ho-Ba-Cu oxide, exhibiting the onset of superconductivity at 93K and the resistance vanishing below 76 K, by heating a mixture of powders $Ho_2O_3$, $BaCO_3$ and CuO with the composition Ho:Ba:Cu=0.246:0.336:1 at 850° C. in air for two hours. The sample was then pressed into a rectangular shape and sintered at 800° C. for one hour. The sample looked black, but a small part was green.

Matsushita et al., *Jpn. J. Appl. Phys.* 26, L332-L333 (1987), disclose the preparation of $Ba_{0.5}Y_{0.5}Cu_1O_x$ by mixing appropriate amounts of $BaCO_3$ (purity 99.9%), $Y_2O_3$ (99.99%) and CuO (99.9%). The mixture was calcined at 1000° C. for 11 hours in a flowing oxygen atmosphere. The resultant mixture was then pulverized and cold-pressed into disks. The disks were sintered at 9900° C. for 4 hours in the same oxygen atmosphere. The calcined powder and disks were black. A superconducting onset temperature of 100K was observed.

Maeno et al., *Jpn. J. Appl. Phys.* 26, L329-L331 (1987), disclose the preparation of various Y-Ba-Cu oxides by mixing powders of $Y_2O_3$, $BaCO_3$ and CuO, all 99.99% pure, with a pestle and mortar. The powders were pressed at 100 kgf/$cm^2$ ($98 \times 10^4$ Pa) for 10-15 minutes to form pellets with a diameter of 12 mm. The pellets were black. The heat treatment was performed in two steps in air. First, the pellets were heated in a horizontal, tubular furnace at 800° C. for 12 hours before the heater was turned off to cool the pellets in the furnace. The pellets were taken out of the furnace at about 200° C. About half the samples around the center of the furnace turned green in color, while others away from the center remained black. The strong correlation with location suggested to the authors that this reaction occurs critically at about 800° C. The pellets were then heated at 1200° C. for 3 hours and then allowed to cool. Pellets which turned light green during the first heat treatment became very hard solids whereas pellets which remained black in the first heat treatment slightly melted or melted down. Three of the samples exhibited an onset of superconductivity above 90K.

Iguchi et al., *Jpn. J. Appl. Phys.* 26, L327-L328 (1987), disclose the preparation of superconducting $Y_{0.8}Ba_{1.2}CuO_y$ by sintering a stoichiometrical mixture of $Y_2O_3$, $BaCO_3$ and CuO at 900 20 C. and at 10000° C. in air.

Hosoya et al., *Jpn. J. Appl. Phys.* 26, L325-L326 (1987), disclose the preparation of various superconducting specimens of the L-M-Cu-O systems where L=Yb, Lu, Y, La, Ho and Dy and M=Ba and a mixture of Ba and Sr by heating the mixtures of appropriate amounts of the oxides of the rare earth elements (99.9% pure), CuO, $SrCO_3$ and/or $BaCO_3$ in air at about 900° C. Green powder was obtained. The powder samples were pressed to form pellets which were heated in air until the color became black.

Takagi et al., *Jpn. J. Appl. Phys.* 26, L320-L321 (1987), disclose the preparation of various Y-Ba-Cu oxides by reacting mixtures containing the prescribed amounts of powders of $Y_2O_3$, $BaCO_3$ and CuO at 1000° C., remixing and heat-treating at 1100° C. for a few to several hours. An onset temperature of superconductivity at 95K or higher was observed for a specimen with the nominal composition of $(Y_{0.9}Ba_{0.1})CuO_y$.

Hikami et al., *Jpn. J. Aopl. Phys.* 26, L314-L315 (1987), disclose the preparation of compositions in the Y-Ba-Cu-0 system by heating the powders of $Y_2O_3$, $BaCO_3$ and CuO to 800° C. or 900° C. in air for 2-4 hours, pressing into pellets at 4 kbars ($4 \times 10^5$ Pa) and reheating to 800° C. in air for 2 hours for sintering. The samples show an onset of superconductivity at 85K and a vanishing resistance at 45K.

Bourne et al., *Phys. Letters A* 120, 494–496 (1987), disclose the preparation of Y-Ba-Cu-0 samples of $Y_{2-x}Ba_xCuO_4$ by pressing finely ground powders of $Y_2O_3$, $BaCO_3$ and CuO into pellets and sintering the pellets in an oxygen atmosphere at 1082° C. Superconductivity for samples having x equal to about 0.8 was reported.

Moodenbaugh et al., *Phys. Rev. Lett.* 58, 1885–1887 (1987), disclose superconductivity near 90 K in multiphase samples with nominal composition $Lu_{1.8}Ba_{0.2}CuO_4$ prepared from dried $Lu_2O_3$, high-purity $BaCP_3$ (presumably $BaCO_3$), and fully oxidized CuO. These powders were ground together in an agate mortar and then fired overnight in air at 1000° C. in Pt crucibles. This material was ground again, pelletized, and then fired at 1100° C. in air for 4–12 hours in Pt crucibles. Additional samples fired solely at 1000° C. and those fired at 1200° C. show no signs of superconductivity.

Hor et al., *Phys. Rev. Lett.* 58, 1891–1894 (1987), disclose superconductivity in the 90K range in $ABa_2Cu_3O_{6+x}$ with A=La, Nd, Sm, Eu, Gd, Ho, Er, and Lu in addition to Y. The samples were synthesized by the solid-state reaction of appropriate amounts of sesquioxides of La, Nd, Sm, Eu, Gd, Ho, Er, and Lu, $BaCO_3$ and CuO in a manner similar to that described in Chu et al., *Phys. Rev. Lett.* 58, 405 (1987) and Chu et al., *Science* 235, 567 (1987).

SUMMARY OF THE INVENTION

This invention provides an improved process for preparing superconducting compositions having the formula $MBa_2Cu_3O_x$ wherein M is selected from the group consisting of Y, Nd, Sm, Eu, Gd, Dy, Ho, Er, Tm, Yb, and Lu; x is from about 6.5 to about 7.0; said composition having a superconducting transition temperature of about 90K; said process consisting essentially of heating a precursor powder in an oxygen-containing atmosphere at a temperature from about 875° C. to about 950° C. for a time sufficient to form $MBa_2Cu_3O_y$, where y is from about 6.0 to about 6.4; and maintaining the $MBa_2Cu_3O_y$ in an oxygen-containing atmosphere while cooling for a time sufficient to obtain the desired product; said precursor powder being prepared by (a) forming an aqueous solution of $M(NO_3)_3$, $Ba(NO_3)_2$ and $Cu(NO_3)_2$ in an atomic ratio of M:Ba:Cu of about 1:2:3; (b) adding the resulting solution to sufficient oxalic acid to precipitate the metals present as salts, and (c) spray drying the resulting slurry to obtain the precursor powder. Prior to heating at about 875° C.-950° C., the precursor powder can be heated at a temperature from about 300° C. to about 600° C. for a time sufficient to decrease its weight about 50% and then pressed into a desired shape. The invention also provides the shaped article prepared by the process of the invention.

DETAILED DESCRIPTION OF THE INVENTION

The process of the invention provides an improved process for preparing superconducting compositions having the formula $MBa_2Cu_3O_x$. M is selected from the group consisting of Y, Nd, Sm, Eu, Gd, Dy, Ho, Er, Tm, Yb and Lu, but is preferably Y. The parameter x is from about 6.5 to about 7.0, but is preferably from about 6.8 to about 7.0.

In the process of the invention a precursor powder is prepared for later heating. The precursor powder is prepared by forming an aqueous solution of $M(NO_3)_3$, $Ba(NO_3)_2$ and $Cu(NO_3)_2$ in an atomic ratio of M:Ba:Cu of about 1:2:3. The aqueous solution of nitrates can be prepared by starting with the appropriate nitrate salts.

The solution of nitrates is added to an amount of oxalic acid at least sufficient to precipitate substantially all the metals present as salts, e.g., nitrates and oxalates. Typically, the amount of oxalic acid used is about one and a half times the stiochiometric amount needed to convert all the metals present to metal oxalates, although larger amounts can be used. As used herein, the expression "substantially all" means about 85% or more. To achieve complete precipitation of the metal ions would require increasing the pH of the resulting slurry, for example, by adding alkali metal hydroxide. This would result in an unacceptable alkali-contaminated precipitate.

The resulting slurry is then spray dried using conventional spray-drying techniques and equipment to obtain a free-flowing precursor powder. Spray drying the slurry provides a well-mixed precursor and results in the preparation of a uniform, practically single-phase, superconducting $MBa_2Cu_3O_x$ product after the heating and cooling steps as prescribed herein.

Preferably, the starting materials used in the process of the invention are of high purity, e.g. 99.99% by weight for CuO and 99.9% by weight for $M_2O_3$. Less pure starting materials can be used; however, the product may then contain an amount of another phase material comparable to the amount of impurity in the starting materials. It is particularly important to avoid the presence of impurities containing iron and other transition, but non-rare earth, metals in the reactants.

The precursor powder is then heated in an oxygen-containing atmosphere at a temperature from about 875° C. to about 950° C., preferably from about 900° C. to about 950° C., for a time sufficient to form $MBa_2Cu_3O_y$, where y is from about 6.0 to about 6.4. It has been determined by TGA data that when the precursor powder is heated to 900° C., y is from about 6.0 to about 6.4. Alternatively, prior to heating at this temperature, the precursor powder can be pre-fired at a temperature from about 300° C. to about 600° C. for a time sufficient to decrease the weight of the powder about 50%, and then pressed into a disk, bar or other desired shape using conventional techniques.

For heating, the precursor powder is placed in a non-reactive container such as an alumina or gold crucible. The oxygen-containing atmosphere can be air or oxygen gas, but is preferably oxygen. The container with the precursor powder is placed in a furnace and brought to a temperature of from about 875° C. to about 950° C. It is the total time that the precursor powder is at temperatures in this range that is important. When the final heating temperature is 900° C., about an hour is sufficient time to maintain the sample at 900° C. to produce, after cooling as prescribed herein, practically single-phase superconducting $MBa_2Cu_3O_x$. Alternatively, the container can be placed directly into an oven already heated to the final heating temperature. Longer heating times can be used. After cooling as described herein, the $MBa_2Cu_3O_x$ powder can be pressed into a desired shape and sintered to provide a shaped article.

At the end of the heating time, the furnace is turned off, and the resulting material is allowed to cool in the oxygen-containing atmosphere for a time sufficient to obtain the desired product. Preferably, the material is cooled to about ambient temperature, i.e. 22° C., (a time interval of about a few hours) before the sample container is removed from the furnace. During the cooling step, the oxygen content of the material increases to give the desired $MBa_2Cu_3O_x$ product The additional oxygen which enters into the crystalline lattice of the material during this cooling step to form the desired product does so by diffusion. The rate at which oxygen enters the lattice is determined by a complex function of time, temperature, oxygen content of the atmosphere, sample form, etc. Consequently, there are numerous combinations of these conditions that will result in the desired product. For example, the rate of oxygen uptake by the material at 500° C. in air is rapid, and the desired product can be obtained in less than an hour under these conditions when the sample is in the form of a loosely packed, fine particle powder. However, if the sample is in the form of larger particles, densely packed powders or shaped articles, the times required to obtain the desired product at 500° C. in air will increase. Well sintered, shaped articles will take longer to form the desired product than will more porous ones, and for larger, well sintered, shaped articles many hours may be required.

A convenient procedure for obtaining the desired product when the material is in the form of a powder or a small shaped object and the heating is conducted in a muffle or tube furnace is to turn off the furnace and to allow the material to cool in the furnace to a temperature approaching ambient temperature (about 22° C.) which typically requires a few hours. In one example, cooling in such a furnace to below about 40° C. was found to be sufficient. A convenient and reproducible heating and cooling procedure can be effected by using a belt furnace in which the crucible containing the precursor powder is placed on a slow-moving belt. The material is passed through three temperature zones of equal length. The first zone is not heated, the second is heated to the desired final temperature and the third zone has a water-cooled jacket for cooling the sample. The atmosphere in the furnace is air. Typical times in such a belt furnace are about 5 hours with ⅓ of the total time spent in each zone to provide heating and cooling times of about 1.5 hours which were found to be sufficient.

Increasing the partial pressure of oxygen in the atmosphere surrounding the sample during cooling increases the rate at which oxygen enters the lattice. If, in a particular experiment, the material is cooled in such a manner that the $MBa_2Cu_3O_x$ product is not obtained, the material can be heated to an intermediate temperature, such as 500° C., between ambient temperature and the final temperature used in the heating step and held at this temperature for a sufficient time to obtain the desired product. If the $MBa_2Cu_3O_x$ product is pressed into a desired shape and sintered at about 900° C. to about 950° C., the above cooling considerations would then apply to the resulting shaped article.

The product formed by the process of the invention is practically single-phase and has orthorhombic symmetry as determined by X-ray diffraction measurements.

The process of this invention provides a single heating-step method for preparing a superconducting $MBa_2Cu_3O_x$ composition that does not require a special atmosphere during the heating step, subsequent grinding, reheating or annealing, extended heating times or refining of the product to separate the desired superconducting $MBa_2Cu_3O_x$ composition from other phases. The best mode contemplated for carrying out the invention is described in Example 2.

As used herein the phrase "consisting essentially of" means that additional steps can be added to the process of the invention so long as such steps do not materially alter the basic and novel characteristics of the invention. Superconductivity can be confirmed by observing flux exclusion, i.e., the Meissner effect.

The invention is further illustrated by the following examples in which temperatures are in degrees Celsius unless otherwise indicated. Reagent grade chemicals were used to demonstrate that the process of the invention can result in practically single-phase $MBa_2Cu_3O_x$.

EXAMPLE 1

An aqueous yttrium nitrate solution (135.5 mL, 0.075 mole of Y) was combined with 511.2 mL of aqueous barium nitrate solution (0.15 mole of Ba) and 108.3 mL of aqueous cupric nitrate solution (0.225 mole of Cu). The combined nitrate solution was added dropwise to 750 mL of 1M oxalic acid solution (about 1.5 times the stiochiometric amount required to convert all the metals to oxalates) and a blue precipitate formed. The resulting slurry was stirred well and spray dried to give a fine blue powder. Spray drying was performed by using a Buchi No. 190 mini spray dryer operated with $N_2$ as the atomizing gas. An inlet temperature of 230° and an outlet temperature of 105° were employed. The chamber atmosphere was air.

A 0.71 g portion of the resulting spray-dried precursor powder was placed in an alumina ($Al_2O_3$) container and heated in flowing oxygen in a tube furnace from ambient temperature to a final heating temperature of 900° over a period of about 1.5 hours. The temperature was maintained at 900° for 19 hours. The furnace was then turned off and allowed to cool to below 40° (an elapsed time of about 5 hours) after which the sample was removed. The product was black and the yield was 0.34 g. An X-ray diffraction powder pattern was obtained of the product and indicated that the product was $YBa_2Cu_3O_x$ with orthorhombic symmetry and contained very small amounts of $BaCuO_2$ and $Y_2Cu_2O_5$ as an impurities. Measurement of the Meissner effect showed that the material had a superconducting transition onset temperature, $T_c$ of about 87K.

EXAMPLE 2

An aqueous yttrium nitrate solution (300.4 mL, 0.075 mole of Y, 2.22 g of Y per 100 mL of solution) was combined with 489.3 mL of aqueous barium nitrate solution (0.15 mole of Ba, 4.21 g of Ba per 100 mL of solution) and 108.4 mL of aqueous cupric nitrate solution (0.225 mole of Cu, 13.2 g of Cu per 100 mL of solution). The combined nitrate solution was diluted to 1.0 L with water. In order to demonstrate the advantage of various steps of the process of the invention, the combined nitrate solution was divided into four portions. One portion was used to prepare the precursor powder according to the invention. The other three portions were used to prepare precursor powder by other methods, i.e., by spray drying the nitrate solution, by using the precipitate obtained after oxalic acid addition to the combined nitrate solution, and by using the precipitate obtained after adding oxalic acid and sodium hydroxide to the nitrate solution.

Each of the four precursor powders was placed in an alumina tray and heated in a belt furnace at 900° (temperature of the second zone) in air with the total time in the furnace per sample being about 4.5 hours. An X-ray diffraction powder pattern was obtained for each product.

(a) Process of the invention

The nitrate solution (700 mL) was added dropwise to 525 mL of 1M oxalic solution and a blue precipitate formed. The resulting slurry was stirred well and then spray dried to give a fine blue powder. Spray drying was performed by using a Buchi No. 190 mini spray dryer operated with $N_2$ as the atomizing gas. An inlet temperature of 230° and an outlet temperature of 130° were employed. The chamber atmosphere was air.

A 12.33 g portion of the resulting spray-dried precursor powder was heated as described above. The product powder (5.91 g) was black/gray. The X-ray diffraction powder pattern of the product indicated that the material was $YBa_2Cu_3O_x$ with orthorhombic symmetry and contained a trace of $Y_2Cu_2O_5$.

(b) Spray Drying the Nitrate Solution

The nitrate solution (100 mL) was sprayed dried to give a fine blue-green powder. Spray drying was performed by using a Buchi No. 190 spray dryer operated with $N_2$ as the atomizing gas, an inlet temperature of 230° and an outlet temperature of 147°. The chamber atmosphere was air.

A 1.061 g portion of the resulting spray-dried powder was heated as described above. The product was a black/grey powder (0.576 g). The X-ray diffraction powder pattern of the material indicated that the product was mainly $YBa_2Cu_3O_x$ with orthorhombic symmetry and was significantly contaminated with $Y_2Cu_2O_5$ and $Y_2BaCuO_5$. This procedure was repeated several times, and the product produced was generally hygroscopic.

(c) Precipitate obtained by adding oxalic acid to the nitrate solution

A 100 mL portion of the combined nitrate solution was added dropwise to 75 mL of 1M aqueous solution of oxalic acid and a blue precipitate formed. The resulting slurry was filtered to give a blue powder. A 1.559 g portion of this powder was heated as described above giving 0.725 g of a black powder. The X-ray diffraction powder pattern of the resulting material indicated that the product was mainly $YBa_2Cu_3O_x$ with orthorhombic symmetry and was 1, significantly contaminated with $Y_2BaCuO_5$.

(d) Precipitate formed by adding oxalic acid and NaOH to the nitrate solution A 100 mL portion of the combined nitrate solution was added dropwise to 75 mL of 1M aqueous solution of oxalic acid and a blue precipitate formed. The resulting slurry was made basic (pH of 9.0) by adding 197 mL of approximately 1M NaOH in order to attempt to form a precipitate with the atomic ratio of Y:Ba:Cu of about 1:2:3. Filtration of the resulting slurry yielded a blue powder which was used as a precursor powder. However, the filtrate was blue indicating the presence of divalent copper ions in the filtrate.

A 1.227 g portion of the resulting precursor powder was heated as described above, thereby resulting in a black product visibly contaminated with a green phase. The yield was 0.865 g. The X-ray diffraction powder pattern of the product indicated that the product was mainly $YBa_2Cu_3O_x$ with orthorhombic symmetry and contained a small amount of $Y_2BaCuO_5$.

The X-ray diffraction pattern of the product produced by the process of the invention displayed less (in number and intensity) diffraction peaks for impurities than did patterns for the products produced by the other procedures.

The invention being claimed is:

1. An improved process for preparing a superconducting composition having the formula $MBa_2Cu_3O_x$ wherein M is selected from the group consisting of Y, Nd, Sm, Eu, Gd, Dy, Ho, Er, Tm, Yb and Lu;

x is from about 6.5 to about 7.0;

said composition having a superconducting transition temperature of about 90K;

said process consisting essentially of heating a precursor powder in an oxygen-containing atmosphere at a temperature from about 875° C. to about 950° C. for a time sufficient to form $MBa_2Cu_3O_y$, where y is from about 6.0 to about 6.4; and maintaining the $MBa_2Cu_3O_y$ in an oxygen-containing atmosphere while cooling for a time sufficient to obtain the desired product;

said precursor powder being prepared by (a) forming an aqueous solution of $M(NO_3)_3$, $Ba(NO_3)_2$ and $Cu(NO_3)_2$ in an atomic ratio of M:Ba:Cu of about 1:2:3, (b) adding the resulting solution to sufficient oxalic acid to precipitate the metals present as salts, and (c) spray drying the resulting slurry to obtain the precursor powder.

2. A process according to claim 1 wherein the precursor powder is heated at a temperature from about 900° C. to about 950° C.

3. A process according to claim 2 wherein x is from about 6.8 to about 7.0.

4. A process according to claim 3 wherein

5. A process according to claim 1 wherein the $MBa_2Cu_3O_x$ powder is pressed into a desired shape and sintered.

6. A process according to claim 2 wherein the $MBa_2Cu_3O_x$ powder is pressed into a desired shape and sintered.

7. A process according to claim 3 wherein the $MBa_2Cu_3O_x$ powder is pressed into a desired shape and sintered.

8. A process according to claim 4 wherein the $MBa_2Cu_3O_x$ powder is pressed into a desired shape and sintered.

9. A process according to claim 1 wherein the precursor powder is, prior to heating at a temperature from about 875° C. to about 900° C., heated at a temperature from about 300° C. to about 600° C. for a time sufficient to decrease its weight about 50% and is then pressed into a desired shape.

10. A process according to claim 2 wherein the precursor powder is, prior to heating at a temperature from about 875° C. to about 900° C., heated at a temperature from about 300° C. to about 600° C. for a time sufficient to decrease its weight about 50% and is then pressed into a desired shape.

11. A process according to claim 3 wherein the precursor powder is, prior to heating at a temperature from about 875° C. to about 900° C., heated at a temperature from about 300° C. to about 600° C. for a time sufficient to decrease its weight about 50% and is then pressed into a desired shape.

12. A process according to claim 4 wherein the precursor powder is, prior to heating at a temperature from about 875° C. to about 900° C., heated at a temperature from about 300° C. to about 600° C. for a time sufficient to decrease its weight about 50% and is then pressed into a desired shape.

* * * * *